United States Patent [19]

Kim

[11] Patent Number: 5,702,867
[45] Date of Patent: Dec. 30, 1997

[54] METHOD FOR FORMING FINE PATTERN IN SEMICONDUCTOR DEVICE

[75] Inventor: Myung Seon Kim, Kyoungki-do, Rep. of Korea

[73] Assignee: Hyundai Electronics Industries, Co., Ltd., Kyoungki-do, Rep. of Korea

[21] Appl. No.: 294,539

[22] Filed: Aug. 23, 1994

[30] Foreign Application Priority Data

Aug. 23, 1993 [KR] Rep. of Korea ............... 1993-16329

[51] Int. Cl.$^6$ ...................................... G03F 7/36
[52] U.S. Cl. ................ 430/291; 430/316; 430/317; 430/322; 156/625.1
[58] Field of Search ................ 156/625.1; 430/291, 430/316, 317, 322

[56] References Cited

U.S. PATENT DOCUMENTS

| | | |
|---|---|---|
| 5,322,765 | 6/1994 | Clecak et al. ............ 430/270.1 |
| 5,498,514 | 3/1996 | Nakao et al. ............ 430/271.1 |

*Primary Examiner*—John S. Chu
*Attorney, Agent, or Firm*—Reid & Priest LLP

[57] ABSTRACT

A method for forming fine pattern in a semiconductor device. It comprises the steps of: providing an objective material layer to be patterned covering a photosensitive film atop a semiconductor substrate; selectively exposing the surface of the photosensitive film, to determine a region to be patterned, in the surface of the photosensitive film; diffusing silicon into the surface of the photosensitive film by use of hexamethyl disilazane (HMDS) or tetramethyl disilazane (TMDS), to form a uniformly thin, silylated photosensitive material film at an unexposed surface of the photosensitive film and a thick, silylated photosensitive material film having a shape of convex lens at the exposed surface of the photosensitive film; etching the silylated photosensitive material layer and the photosensitive film with plasma containing $NF_3/O_2$, in such a predetermined thickness as to remove the edge of the silylated photosensitive material having a shape of convex lens, to form a silylated photosensitive material pattern which finely determines the region to be patterned; and subjecting the photosensitive film exposed by the silylated photosensitive material pattern to anisotropic etch with oxygen-based plasma, to selectively expose the objective material layer to be patterned. Keeping the CD of the photosensitive film pattern constant, it can provide a clean and smooth surface.

3 Claims, 2 Drawing Sheets

METHOD FOR FORMING FINE PATTERN IN SEMICONDUCTOR DEVICE

BACKGROUND OF THE INVENTION

1. Field of the Invention

The present invention relates, in general, to a method for the formation of fine pattern on a semiconductor substrate and, more particularly, to an improvement in the degree of integration without changing the critical dimension of photosensitive film pattern in a semiconductor device, along with the method.

2. Description of the Prior Art

As the degree of integration of semiconductor device increases the lead wire becomes narrow and is less 0.5 µM wide, which makes photosensitive film pattern for forming patterns for circuit device and lead wire become fine.

Conventionally, a photosensitive film pattern is formed by photoprinting single-layer resist. However, the conventional formation method for photosensitive film pattern is problematic in that a notching effect, that is, depression of a part of the photosensitive film pattern, is generated. In addition, a proximity effect that the size of photosensitive pattern at an area of high pattern density is different from that of photosensitive pattern at an area of low pattern density also is generated when carrying out the conventional method. The notching and proximity effects are produced by geometric influence of a pattern of material that has been formed below the single layer resist.

Another problem of the conventional method is resided in that a bridge, by means of which a photosensitive film has a false figure is generated due to poor exposure and development and to a necking phenomenon induced by the difference of focal depth of a lens collecting light. The difference of focal depth of lens is caused by positioning the focal point of the lens on a surface of wafer wherein a structure of global profile is formed.

Many efforts have been made to solve the above-mentioned problems. For example, there are suggested a multi-layer resist process and a diffusion enhanced silylated resist (hereinafter referred to as "DESIRE") process, whereby an invisible latent image layer is thinned, to bring about an improvement in fineness of the photosensitive film pattern. In both the multi-layer resist process and the DESIRE process, an upper surface of the photosensitive film is initially patterned and then, a lower layer of the photosensitive film is subjected to dry etch, to form a photosensitive film pattern. Both the processes are generally called dry develop process.

There is a process utilizing three-layer resist, representative of the multi-layer process. This three-layer resist process, however, is complicated and uneconomical in view of cost even though it utilizes relatively simple principle.

On the other hand, the DESIRE process is invented to overcome the disadvantages of the three-layer process, utilizing single layer resist. The DESIRE process is grouped into two kinds. One comprises one-step etching, while the other comprises two-step etching.

In the DESIRE process comprising one-step etching, the surface of photosensitive film of single layer is selectively silylated and the non-silylated photosensitive film is dry etched with one kind of gas, so as to form a photosensitive film pattern.

On the contrary, in the DESIRE process comprising two-step etching, the surface of photosensitive film of single layer is selectively silylated and then, all area of the surface, both the silylated and the non-silylated, is removed by dry etch in a predetermined thickness. The DESIRE process comprising two-step etching is completed by removing the non-silylated photosensitive film with dry etch, so as to form a photosensitive film pattern. The first dry etching step comprises utilization of $CF_4/O_2$ or $C_2F_6/O_2$ gas or application of radio frequency (hereinafter referred to as "RF") with high power so as to keep an etch ratio of the silylated photosensitive film area to the non-silylated photosensitive film area 1:1. The DESIRE process comprising two-step etching is superior to the other in fineness of photosensitive film pattern.

When $CF_4/O_2$ or $C_2F_6/O_2$ is employed in the first dry etching step, the surface of the silylated photosensitive film is covered with an oxide layer due to the oxygen gas, which oxide layer in turn is etched by the etching solution. $CF_4$ or $C_2F_4$. This phenomenon makes the DESIRE process disadvantageous in that CD of the photosensitive film pattern formed is dependent on the degree of formation of the oxide layer and polymer is produced.

In case of employing oxygen gas and RF with high power in the first dry etching step of the DESIRE process, the RF with high power makes the side wall of the photosensitive film pattern rough and does not keep the CD of the photosensitive film pattern constant. Consequently, the degree of integration of semiconductor device has a limit with the conventional formation methods for fine pattern.

SUMMARY OF THE INVENTION

An object of the present invention, therefore, is to overcome the above problems encountered in prior arts and to provide a method for the formation of fine pattern in semiconductor device, capable of forming photosensitive film pattern without changing critical dimension thereof so as to improve the degree of integration of semiconductor device.

The above object of the present invention can be accomplished by a provision of a method for forming fine pattern in semiconductor device, comprising the steps of: providing an objective material layer to be patterned covering a photosensitive film atop a semiconductor substrate; selectively exposing the surface of the photosensitive film, to determine a region to be patterned, in the surface of the photosensitive film; diffusing silicon into the surface of the photosensitive film by use of hexamethyl disilazane (HMDS) or tetramethyl disilazane (TMDS), to form a uniformly thin, silylated photosensitive material film at an unexposed surface of the photosensitive film and a thick, silylated photosensitive material film having a shape of convex lens at the exposed surface of the photosensitive film; etching the silylated photosensitive material layer and the photosensitive film with plasma containing $NF_3/O_2$, in such a predetermined thickness as to remove the edge of the silylated photosensitive material having a shape of convex lens, to form a silylated photosensitive material pattern which finely determines the region to be patterned; and subjecting the photosensitive film exposed by the silylated photosensitive material pattern to anisotropic etch with oxygen-based plasma, to selectively expose the objective material layer to be patterned.

BRIEF DESCRIPTION OF THE DRAWINGS

The above object and other advantages of the present invention will become more apparent by describing in detail the preferred embodiment of the present invention with reference to the attached drawings in which.

DETAILED DESCRIPTION OF THE PREFERRED EMBODIMENT

Figure 1:
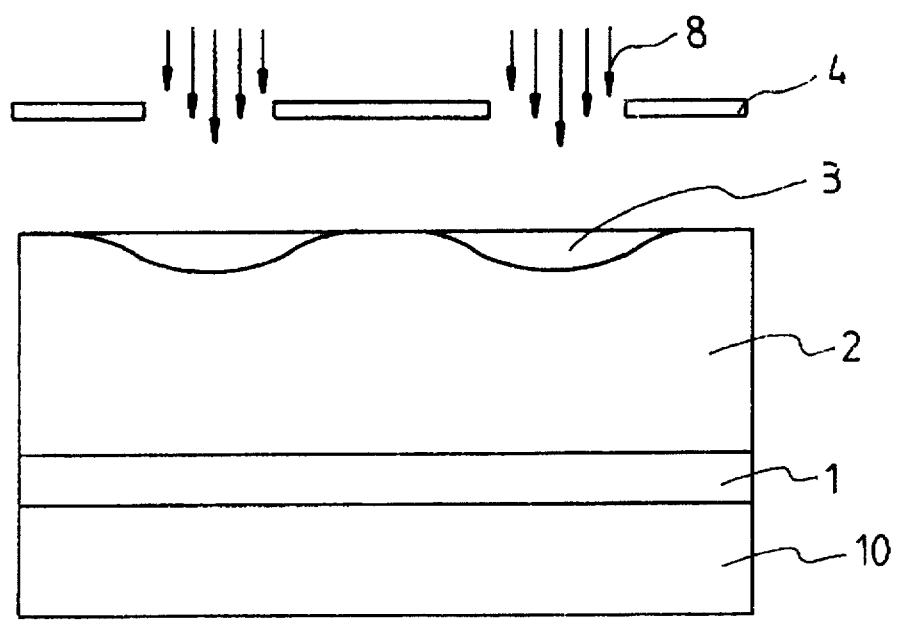
FIGS. 1 through 4 are cross-sectional views stepwise illustrating a method of forming fine pattern of semiconductor device according to the preferred embodiment of the present invention.

The application of the preferred embodiment of the present invention is best understood by referring to FIGS. 1 through 4, wherein like reference numerals are used for like and corresponding parts of the drawings, respectively.

To begin with, a semiconductor substrate 10 is covered with an objective material layer 1 to be patterned on which a photosensitive film 2 is coated in a predetermined thickness, as shown in FIG. 1. In this figure, there also is shown an exposed region 3 in the surface part of the photosensitive film 2 that is formed selectively by a light, as indicated by arrows, to the surface of the photosensitive film 2 through a mask 4 positioned above the photosensitive film 2. In the exposed region 3, the atomic bonding structure of the photosensitive material is destroyed. The destruction of the atomic bonding structure in the photosensitive material is caused by the light 8. Since, when light is passed through the opening of the mask 4, it is diffracted, the destruction of the atomic bonding structure of the photosensitive material is generated more deeply at the center part of the exposed region 3 than at the edge parts thereof. The diffraction of the light also causes the exposed region 3 to have larger area than that to be patterned in practice, that is, the area of the opening of the mask 4.

Figure 2:
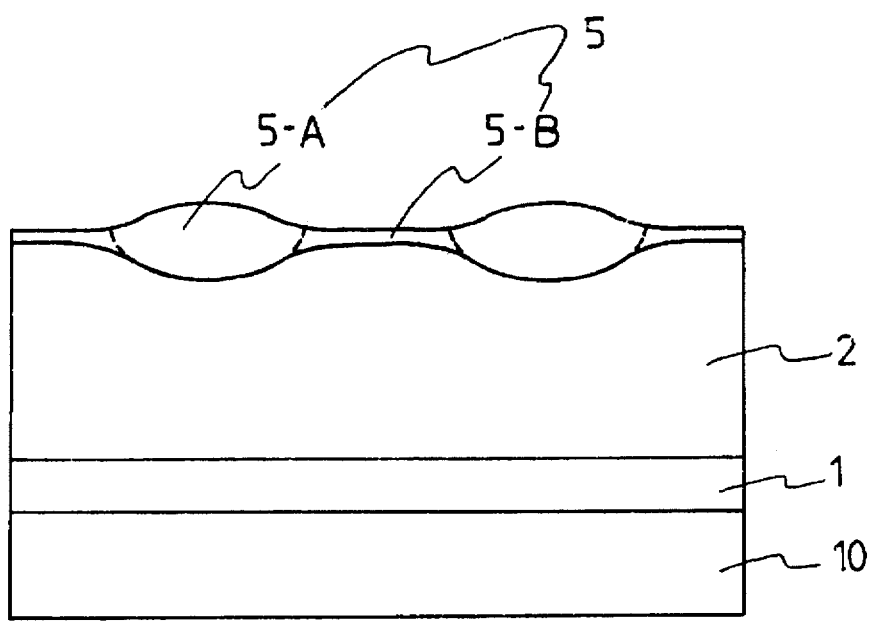

FIG. 2 is a cross section after an unexposed surface of the photosensitive film 2 is polymerized by thermal treatment at a temperature ranging from about 160° to about 170° C., followed by diffusion of silicon component into the surface of the photosensitive film 2 with hexamethyl disilazane (HMDS) or tetramethyl disilazane (TMDS). As a result, there is formed a silylated photosensitive material layer 5 covering the entire surface area of the photosensitive film 2.

In the silylated photosensitive material layer 5, there are two different parts. One is a first silylated photosensitive material part 5-A which is thickly formed at the exposed region 3, and the other is a second silylated photosensitive material part 5-B which is thinly formed at the unexposed region. The first silylated photosensitive material part 5-A of the exposed region 3 has a shape of convex lens due to a large volume of silicon atom. The destruction of the atomic bonding structure of the photosensitive material allows the first silylated photosensitive material part 5-A of the exposed region 3 to be formed more thickly that the second silylated photosensitive material part 5-B of the unexposed region. The first silylated photosensitive material part 5-A of the exposed region 3 is swelled both upward and downward with the angle between the normal thereof and the second silylated photosensitive material part 5-B of the unexposed region being θ at their boundary, as shown in FIG. 2.

Figure 3:
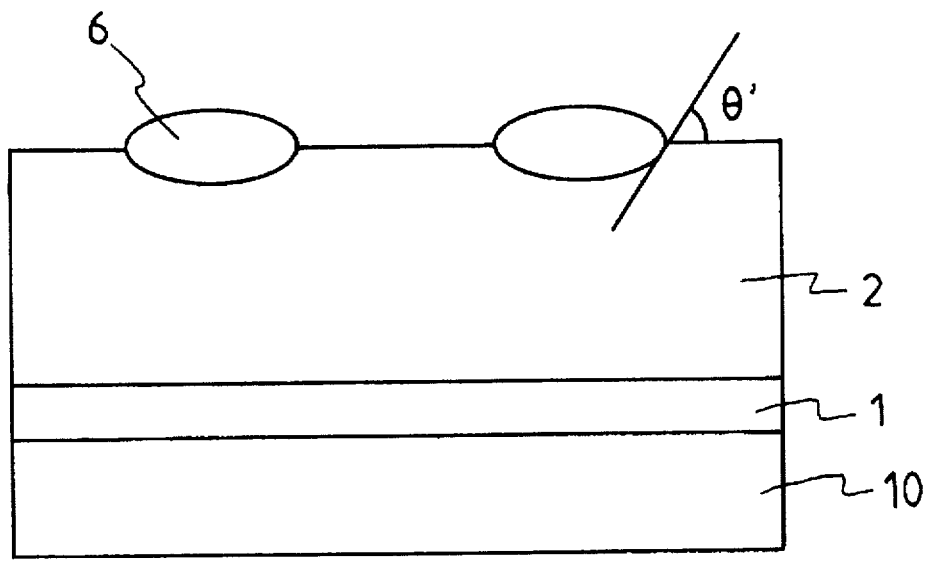

FIG. 3 is a cross-section after the silylated photosensitive material layer 5 and the photosensitive film 2 is dry etched to a predetermined thickness by plasma which contains $NF_3$ and oxygen and exhibits isotropic etch property. As a result, a silylated photosensitive material pattern 6 is formed as shown in FIG. 3. The plasma containing $NF_3$/oxygen used in this step is capable of showing isotropic etch for the silylated photosensitive material layer 5 and the photosensitive film 2 and etches both of them in an etch selection ratio of 1:1. In addition, the plasma containing $NF_3$ and oxygen is able to etch the silylated photosensitive material layer 5 and the photosensitive film 2 within a short time. In accordance with the present invention, in the $NF_3$/oxygen plasma, $NF_3$ amounts to about 30 to about 80% of the total plasma, and the plasma may further comprise gas other than $NF_3$ and oxygen.

During the etching, the second silylated photosensitive material part 5-B of the unexposed region is completely removed along with the epidermis of the photosensitive film 2. The etch is controlled in such a way that the etched thickness of the silylated photosensitive material layer is properly sufficient to remove the edge of the photosensitive material part 5-A of the exposed region 3.

The silylated photosensitive material pattern 6 is positioned on the area irradiated by the light 8 through the mask 4 shown in FIG. 1. At the side part of the photosensitive material pattern 6, the angle between the normal thereof and the surface of the photosensitive film 2 is θ'. This angle of inclination θ' comes to be larger than that θ between the normal of the first silylated photosensitive material part 5-A and the second silylated photosensitive material part 5-B because the edge of the first silylated photosensitive material part 5-A of the exposed region 3 is removed. Consequently, the area of the silylated photosensitive material pattern 6 becomes as large as that of the opening of the mask 4.

Figure 4:
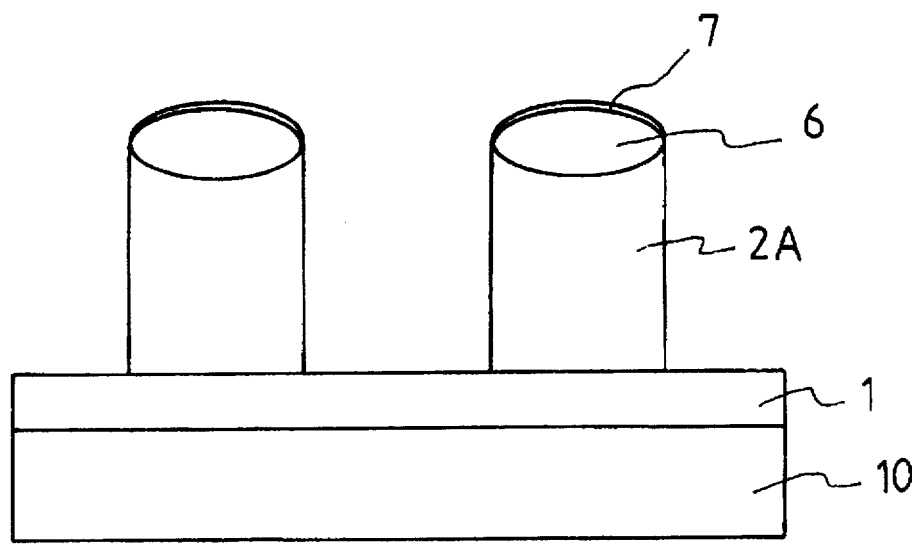

FIG. 4 is a cross section after the photosensitive film 2 which is exposed selectively by the silylated photosensitive material pattern 6 is subjected to anisotropic etch with oxygen-based plasma, to expose the objective material layer 1 to be patterned. As a result, a photosensitive film pattern 2A is formed. In the meanwhile, the oxide layer 7 coated on the silylated photosensitive material pattern 6 is formed, when the photosensitive film 2 is etched, by reaction of silicon contained in the silylated photosensitive material pattern 5 with the oxygen contained in the oxygen-based plasma. During the etching of the photosensitive film 2, the oxide film serves as a mask.

The oxygen-based plasma useful in the present invention may further comprise argon (Ar), nitrogen (N) or helium (He).

The anisotropic etch utilizing the oxygen-based plasma keeps a polymer from being produced, leading to a clean and smooth surface of the side wall of the photosensitive film pattern 2A. In accordance with the method of the present invention, the edge of the silylated photosensitive material pattern 6 is not damaged, which keeps the CD of the photosensitive film pattern 2A constant regardless of the etching process using the oxygen-based plasma. This is attributed to the fact that the angle of inclination θ' of the silylated photosensitive material pattern 6 at its edge is larger than that θ at the first photosensitive material part 5-A at its edge.

As described hereinbefore, in accordance with the method for forming fine pattern of semiconductor device of the present invention, the silylated photosensitive material and the photosensitive film are is isotropically etched in a ratio of 1:1 without applying RF of high power, to form the area of the silylated photosensitive material pattern as large as that of the opening of the mask, thereby keeping the CD of the photosensitive film pattern constant. In addition, the method of the present invention is capable of providing a clean and smooth surface to the side wall of the photosensitive film pattern through anisotropic etch employing oxygen-based plasma.

Other features, advantages and embodiments of the invention disclosed herein will be readily apparent to those exercising ordinary skill after reading the foregoing disclosures. In this regard, while specific embodiments of the invention have been described in considerable detail, variations and modifications of these embodiments can be effected without departing from the spirit and scope of the invention as described and claimed.

What is claimed is:

1. A method for forming fine pattern in a semiconductor device, comprising the steps of:

providing an objective material layer to be patterned atop a semiconductor substrate;

coating a photosensitive film on the objective material layer;

selectively exposing the surface of the photosensitive film to determine a region to be patterned in the surface of the photosensitive film;

diffusing silicon into the surface of the photosensitive film by use of hexamethyl disilazane (HMDS) or tetramethyl disilazane (TMDS), to form a uniformly thin, silylated photosensitive material film at an unexposed surface of the photosensitive film and a thick, silylated photosensitive material film having a shape of convex lens at the exposed surface of the photosensitive film;

etching the silylated photosensitive material layer and the photosensitive film with plasma containing $NF_3$ and $O_2$, to such a predetermined thickness as to remove the edge of the silylated photosensitive material having a shape of convex lens, to form a silylated photosensitive material pattern which finely determines the region to be patterned; and subjecting the photosensitive film exposed by the silylated photosensitive material pattern to anisotropic etch with oxygen-based plasma, to selectively expose the objective material layer to be patterned.

2. A method as set forth as claim 1, wherein the $NF_3$ constitutes about 30 to 80% of said plasma containing $NF_3$ and $O_2$.

3. A method as set forth as claim 1, wherein said oxygen-based plasma further comprises argon, nitrogen or helium.

* * * * *